United States Patent
Stuart et al.

(10) Patent No.: US 12,092,657 B2
(45) Date of Patent: Sep. 17, 2024

(54) TEST PROBE ADAPTER

(71) Applicant: Raytheon Company, Tewksbury, MA (US)

(72) Inventors: Susanne L. Stuart, Petersham, MA (US); John C. Grise, Dracut, MA (US)

(73) Assignee: Raytheon Company, Tewksbury, MA (US)

( * ) Notice: Subject to any disclaimer, the term of this patent is extended or adjusted under 35 U.S.C. 154(b) by 0 days.

(21) Appl. No.: 16/802,405

(22) Filed: Feb. 26, 2020

(65) Prior Publication Data

US 2021/0263073 A1 Aug. 26, 2021

(51) Int. Cl.
*G01R 1/067* (2006.01)
*G01R 13/20* (2006.01)

(52) U.S. Cl.
CPC ......... *G01R 1/06772* (2013.01); *G01R 13/20* (2013.01)

(58) Field of Classification Search
CPC ............................ G01R 1/06772; G01R 13/20
See application file for complete search history.

(56) References Cited

U.S. PATENT DOCUMENTS

| | | | | |
|---|---|---|---|---|
| 3,728,666 A | * | 4/1973 | Shirey | H01R 9/0506 439/579 |
| 4,708,661 A | * | 11/1987 | Morland | H01R 13/6658 439/314 |
| 4,740,746 A | * | 4/1988 | Pollock | G01R 1/06772 324/755.05 |
| 5,235,268 A | | 8/1993 | Harthcock | |
| 5,702,261 A | * | 12/1997 | Wang | H01R 24/46 439/944 |
| 5,857,866 A | * | 1/1999 | Felps | H01R 13/08 439/289 |
| 6,078,184 A | | 6/2000 | Heuermann | |
| 6,402,565 B1 | | 6/2002 | Pooley et al. | |
| 6,404,215 B1 | | 6/2002 | Nightingale et al. | |
| 6,459,274 B1 | * | 10/2002 | Singer | G01R 31/69 324/543 |
| 6,731,104 B1 | * | 5/2004 | Yang | G01R 1/06772 324/110 |

(Continued)

FOREIGN PATENT DOCUMENTS

EP 1726965 A1 11/2006

OTHER PUBLICATIONS

"N2744A T2A Probe Interface Adapter" by Agilent Technologies (Year: 2011).*

(Continued)

*Primary Examiner* — Paresh Patel
(74) *Attorney, Agent, or Firm* — Schwegman Lundberg & Woessner, P.A.

(57) ABSTRACT

A radio frequency (RF) test probe adapter comprises a cable adapter operable for use with a RF test probe and a housing. The cable adapter comprises a cable connector configured to physically couple to a connector of a coaxial cable, a first pin operable to electrically couple a center conductor of the coaxial cable to a first lead of the RF test probe, and a second pin operable to electrically couple an outer conductor of the coaxial cable to a second lead of the test probe. The housing is sized and shaped to secure the RF test probe and the cable adapter in a physically coupled configuration.

17 Claims, 7 Drawing Sheets

(56) References Cited

U.S. PATENT DOCUMENTS

| | | | |
|---|---|---|---|
| 6,734,689 B1* | 5/2004 | Yang | G01R 1/06772 |
| | | | 324/755.05 |
| 7,253,648 B2 | 8/2007 | Yang | |
| 7,354,289 B2 | 4/2008 | Cannon | |
| 9,857,392 B2 | 1/2018 | McTigue et al. | |
| 2004/0027040 A1 | 2/2004 | Derr et al. | |
| 2005/0162147 A1* | 7/2005 | Cannon | H01R 13/625 |
| | | | 324/72.5 |
| 2005/0253603 A1* | 11/2005 | Capps | G01R 1/06772 |
| | | | 324/754.07 |
| 2007/0257657 A1 | 11/2007 | Stevens et al. | |
| 2007/0281532 A1* | 12/2007 | Cannon | G01R 1/06788 |
| | | | 439/318 |
| 2015/0222311 A1 | 8/2015 | Teoh et al. | |

OTHER PUBLICATIONS

"P5200A Series High Voltage Differential Probe Instruction Manual" by Tektronix (Year: 2012).*

Translation of JP 4297800 B2 (Year: 2009).*

Translation of JP 2005-221421 A (Year: 2005).*

Agilent Technologies, 168A and 1169A InfiniiMax Differential and Single-ended Probes, http://www.keysight.com/upload/cmc_upload/All/01169-97011.pdf, Jan. 2010, 34 pages, Agilent Technologies, Inc., Santa Clara, CA.

Agilent Technologies, DSA80000B Digital Signal Analyzer 2-GHz to 13-GHz Oscilloscope Measurement Systems, https://probe.co.il/wp-content/uploads/2018/10/DSO000B.pdf, Dec. 15, 2006, 14 pages, Agilent Technologies, Inc., Santa Clara, CA.

Agilent Technologies, Agilent Technologies Agilent InfiniiMax III Series Probes, https://www.keysight.com/uplod/cmc_upload/All/InfiniiMaxIII_User_Guide.pdf, Jan. 2011, 52 pages, Agilent Technologies, Inc., Santa Clara, CA.

Rohde & Schwarz, R&S RT-ZM Modular Probe System Addressing high-speed probing challenges, https://scdn.rohde-schwarz.com/ur/pws/dl_downloads/dl_common_library/dl_brochures_and_datasheets/pdf_1/RT-ZMxx_flv_en_3607-5690-32_v0200.pdf, Jul. 2019, 8 pages, Rohde & Schwarz GmbH & Co. KG, Germany.

International Search Report for International Application No. PCT/US2020/067061 dated Apr. 7, 2021, 16 pages.

"European Application Serial No. 20845499.1, Communication Pursuant to Article 94(3) EPC mailed Jun. 27, 2024", 6 pgs.

* cited by examiner

TEST PROBE ADAPTER

GOVERNMENT SUPPORT CLAUSE

This invention was made with government support under Contract No. DAAH01-89-C-0458 awarded by the Department of Defense. The government has certain rights in the invention.

BACKGROUND

Test and measurement equipment, such as oscilloscopes have radio frequency (RF) test probes for connecting to an electrical circuit being analyzed. The RF test probes often have multiple test attachments, such as a tip and a ground, for contacting various points of a circuit being measured. To allow for greater flexibility when conducting measurements, the test attachments for a RF test probe can be interchangeable. For example, a RF test probe can have sets of fixed width test attachments that maintain a set width between a tip and the ground, sets of offset test attachments having offset grounds, sets of test attachments with bent tips, and sets of flexible test attachments. Each of the flexible attachments may be interchanged with one another for ease in testing a particular circuit.

In some instances, it may be helpful for the test leads to physically couple with points on a circuit. In such examples, a test lead may have a sprung hook end, allowing a technician to physically couple the tip, the ground, or both to the circuit. The technician may then release the RF test probe and focus on another task. While the interchangeable test attachments are useful for connection to most configurations of circuits, they are not always ideal. For example, the RF test probe can require a technician to physically press the tip and ground against a circuit to obtain a measurement, thereby limiting the use of the operator's hand for other tasks. Or, if a test lead having a sprung hook end is used, the connection can be flimsy, resulting in inaccurate measurements or other errors.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Reference will now be made to the examples illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

An initial overview of the inventive concepts is provided below, and then specific examples are described in further detail later. This initial summary is intended to aid readers in understanding the examples more quickly but is not intended to identify key features or essential features of the examples, nor is it intended to limit the scope of the claimed subject matter.

In one example, disclosed is a radio frequency (RF) test probe adapter. The RF test probe adapter comprises a cable adapter and a housing. The cable adapter is operable for use with a RF test probe and comprises a cable connector configured to physically couple to a connector (e.g., a SubMiniature version A) of a coaxial cable, a first pin operable to electrically couple a center conductor of the coaxial cable to a first lead of the RF test probe, and a second pin operable to electrically couple an outer conductor of the coaxial cable to a second lead of the RF test probe. The housing is sized and shaped to secure the RF test probe and the cable adapter in a physically coupled configuration.

In accordance with a more detailed aspect, the cable adapter can further comprise a base. The base supports the cable connector and each of the first and second pins.

In accordance with a more detailed aspect, the housing can further comprise a ledge operable to interface with and secure the base of the cable adapter within the housing.

In accordance with a more detailed aspect, the base can be configured to be received within the housing, and to be removably supported by the housing, such that the cable adapter is interchangeable with a second cable adapter.

In accordance with a more detailed aspect, the housing can comprise a first portion configured to support a first side of the RF test probe and a first side of the base of the cable adapter, and a second portion configured to support a second side of the RF test probe and a second side of the base of the cable adapter.

In accordance with a more detailed aspect, housing can further comprise a hinge mechanism and a latch of some type, and the first portion and the second portion can be pivotally coupled together via the hinge mechanism or a hinged connection.

Also disclosed is a radio frequency (RF) test probe assembly comprising a radio frequency (RF) test probe, a cable adapter, and a housing. The RF test probe has a first lead and a second lead. The cable adapter is operable for use with the RF test probe and the cable adapter comprises a cable connector configured to physically couple to a connector of a coaxial cable, a first pin operable to electrically couple a center lead of the coaxial cable to the first lead of the RF test probe, and a second pin operable to electrically couple an outer conductor of the coaxial cable adapter to the second lead of the RF test probe. The housing removably secures the RF test probe and the cable adapter in a physically coupled configuration.

In accordance with a more detailed aspect, the cable adapter can further comprise a base supporting the cable connector and each of the first and second pins.

In accordance with a more detailed aspect, the housing can further comprise a ledge removably securing the base of the cable adapter within the housing.

In accordance with a more detailed aspect, the RF test probe assembly can further comprise a second cable adapter. A base of the second cable adapter can be configured to be received within the housing, and to be removably supported by the housing, such that the second cable adapter is interchangeable with the cable adapter.

In accordance with a more detailed aspect, the housing can comprise a first portion configured to support a first side of the RF test probe and a first side of the base of the cable adapter and a second portion configured to support a second side of the RF test probe and a second side of the base of the cable adapter.

In accordance with a more detailed aspect, housing can further comprise a hinge mechanism or hinged connection and a latch of some type, and the first portion and the second portion can be pivotally coupled together via the hinge mechanism or a hinged connection.

Also disclosed is a method for facilitating adaption of leads of a radio frequency (RF) test probe to a coaxial cable. The method comprises configuring a cable adapter and configuring a housing. The cable adapter is configured to have a cable connector operable to physically couple to a connector (e.g., a SubMiniature version A) of a coaxial cable, a first pin operable to electrically couple a center lead of the coaxial cable to a first lead of the RF test probe, and a second pin operable to electrically couple an outer conductor of the coaxial cable to a second lead of the RF test probe. The housing is configured to have an internal cavity sized and shaped to secure the RF test probe and the cable adapter in a physically coupled configuration.

In accordance with a more detailed aspect, the method can further comprise configuring the cable adapter to comprise a base supporting the cable connector and each of the first and second pins.

In accordance with a more detailed aspect, the method can further comprise configuring the internal cavity to be operable to secure a second cable adapter in a physically coupled configuration with the RF test probe.

In accordance with a more detailed aspect, the method can further comprise configuring a second cable adapter to have a second cable connector operable to physically couple to a connector of a second coaxial cable, a first pin operable to electrically couple a center lead of the second coaxial cable to the first lead of the RF test probe, and a second pin operable to electrically couple an outer conductor of the second coaxial cable to the second lead of the RF test probe.

In accordance with a more detailed aspect, the cable adapter can have a first base supporting the cable connector and each of the first and second pins of the cable connector and the second cable adapter can have a second base supporting the cable connector and each of the first and second pins of the second cable connector. The first base and the second base can have substantially the same shape.

In accordance with a more detailed aspect, the method can further comprise configuring the housing to have a first portion operable to support a first side of a radio frequency (RF) test probe and a second portion operable to support a second side of the RF test probe.

In accordance with a more detailed aspect, the method can further comprise configuring the housing with a hinge mechanism to facilitate the pivotal coupling of the first portion and the second portion.

Figure 1:
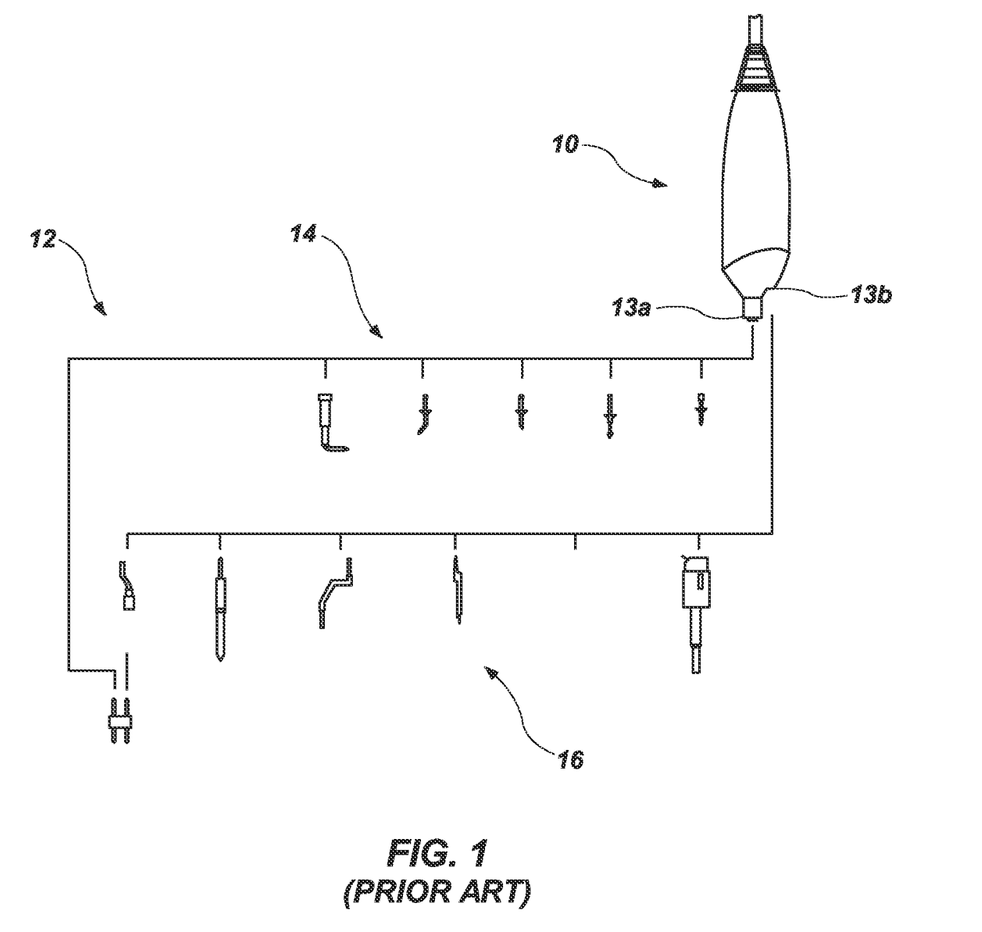
FIG. 1 illustrates an example of an existing RF test probe having or otherwise operable with interchangeable test leads for analyzing a circuit.

To further describe the present technology, examples are now provided with reference to the figures. FIG. 1 illustrates an example of a radio frequency (RF) test probe 10 showing interchangeable test attachments 12 including tips 14 and grounds 16. The interchangeable test attachments 12 can each couple to test leads 13a, 13b of the RF test probe 10. Leads 13a, 13b can comprise sockets in the RF test probe 10, and each interchangeable test attachment 12 can comprise a pin connection for insertion into the RF test probe 10. The interchangeable test attachments 12 can be secured within the sockets by way of a variety of securing means, such as a friction fit type of interface, a threaded interface, a snap fit interface, and others as will be apparent to those skilled in the art. If a particular tip or ground is required for testing a RF circuit, an existing tip or ground can be removed from the RF test probe 10 and the desired tip or ground inserted in its place. In this manner a single RF test probe 10 can be used to test different physical circuit configurations.

Figure 2:
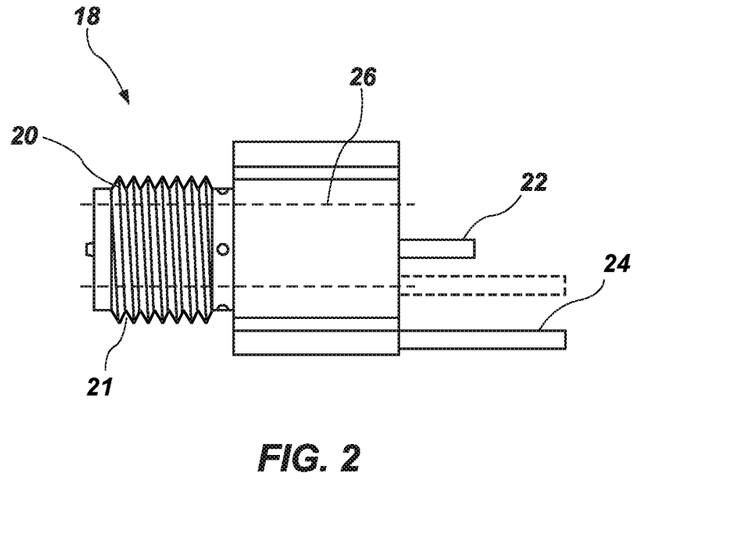
FIG. 2 illustrates a top view of a cable adapter of a radio frequency test probe, the cable adapter being operable to couple to a connector (e.g., a SubMiniature version A) of a coaxial cable, in accordance with an example of the present invention.
Figure 3:
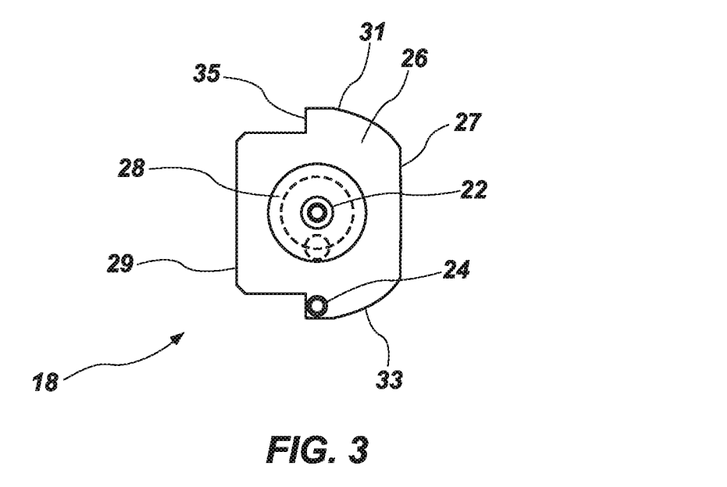
FIG. 3 illustrates an end view of the cable adapter of FIG. 2.

FIGS. 2 and 3 illustrate a cable adapter 18 in accordance with an example of the present disclosure, where the cable adapter 18 is configured and operable for use with a radio frequency (RF) test probe, such as the RF test probe 10 of FIG. 1. The cable adapter 18 can include a cable connector 20, a first pin 22, and a second pin 24 and a base 26. The base 26 can support the cable connector 20 and each of the first pin 22 and the second pin 24. The cable connector 20 can be any coaxial cable connector including, but not limited to, SubMiniature version A (SMA), Subminature version B (SMB), SubMiniature version C (SMC), Bayonet Neil-Concelman (BNC), threaded Neil-Concelman (TNC), and DIN 7/16, concentric Twinax-triax subminiature connector, and any others as would be apparent to those skilled in the art, in either a male or female configuration. The cable connector 20 provides an interface for electrically connecting the cable adapter 18 to a connector of a coaxial cable, as well as physically coupling the cable adapter 18 to the mating connector of the coaxial cable. For example, as shown in FIG. 2, the cable connector 20 can comprise a female type of connector having a series of threads 21, which can be used to physically and releaseably secure the cable adapter 18 to a coaxial cable, and particularly the cable connector 20 to a coaxial cable connector (e.g., a male type of connector that is configured with threads and that is otherwise configured to receive the female type of cable connector 20). Of course, the cable connector 20 can comprise a male type of connector, with the female type of connector being part of the coaxial cable connector.

The first pin 22 can be operable to be electrically coupled to a center conductor of a coaxial cable connected to the cable connector 20. For example, a center conductor of the coaxial cable can be in physical contact with the first pin 22 to transmit a radio frequency (RF) signal. The second pin 24 can be operable to be electrically coupled to an outer conductor of the coaxial cable. For example, an outer conductor of the coaxial cable may be electrically coupled to the threads 21 which are in electrical communication with base 26; and base 26 can be in electrical communication with second pin 24. The first pin 22 and the second pin 24 can be separated by a dielectric material 28 including, but not limited to, polyethylene and fluorinated ethylene propylene. The cable adapter 18 can have a characteristic impedance to match the characteristic impedance of a coaxial cable, such as 50 ohms or 75 ohms.

The first and second pins 22, 24 can be separated by a radial distance corresponding to the separation distance of the leads of a RF test probe. Additionally, second pin 24 can be offset longitudinally from the first pin 22 to account for difference in the longitudinal location of the leads of the RF test probe. In the example of FIG. 2, the second pin 24 extends farther from the base 26 than the first pin 22. The first and second pins 22, 24 can have an outside diameter complementary to an inside diameter of the sockets of the leads of the RF test probe. For example, the outside diameter of the first and second pins 22, 24 can be slightly less than the inside diameter of the sockets of the RF test probe.

With reference to FIGS. 1-3, existing tips 14 and grounds 16 can be removed from RF test probe 10 revealing the leads 13a, 13b for receiving the tips 14 and grounds 16. The cable adapter 18 can then be positioned with first and second pins 22, 24 adjacent the leads 13a, 13b, respectively, and the first and second pins 22, 24 can be inserted into the leads 13a, 13b to, respectively, electrically couple the first pin 22 to the first lead 13a of the RF test probe 10 and the second pin 24 to the second lead 13b of the RF test probe 10.

The base 26 of the cable adapter 18 can have features such as planar lateral surfaces 27, 29, curved lateral surfaces 31, 33, and shoulders 35 formed between the curved lateral surfaces 31, 33 and the lateral surface 29. Second pin 24 can be coupled to the base 26 proximate a shoulder 35. A second or differently configured cable adapter, as an example, can have a base that has substantially the same physical shape as base 26, but that comprises a different type of cable connector supported by the base. For example, a first cable adapter can comprise a male SMA connector, while a second cable adapter can comprise a female SMA connector. Because the bases have the same physical shape, they may be used interchangeably with the RF test probe depending on the cable being connected. Similarly, a third cable adapter can comprise a male BNC cable connector while having a base with the same shape and size as base 26.

As discussed above, the cable adapter 18, and particularly the cable connector 20, can be configured as any coaxial cable connector. FIGS. 2-3 illustrate the configuration for a SMA connector, but also illustrate the configuration for a concentric Twinax-triax subminiature connector, with the third pin and inner conductor for this configuration being shown in dotted lines. It is noted that the pin shown in dotted lines can also be used instead of pin 24 in a SMA type of connector (i.e., the pin can be electrically connected to the lead of the test probe 10, and operable to be electrically coupled to an outer conductor of the coaxial cable).

Figure 4:
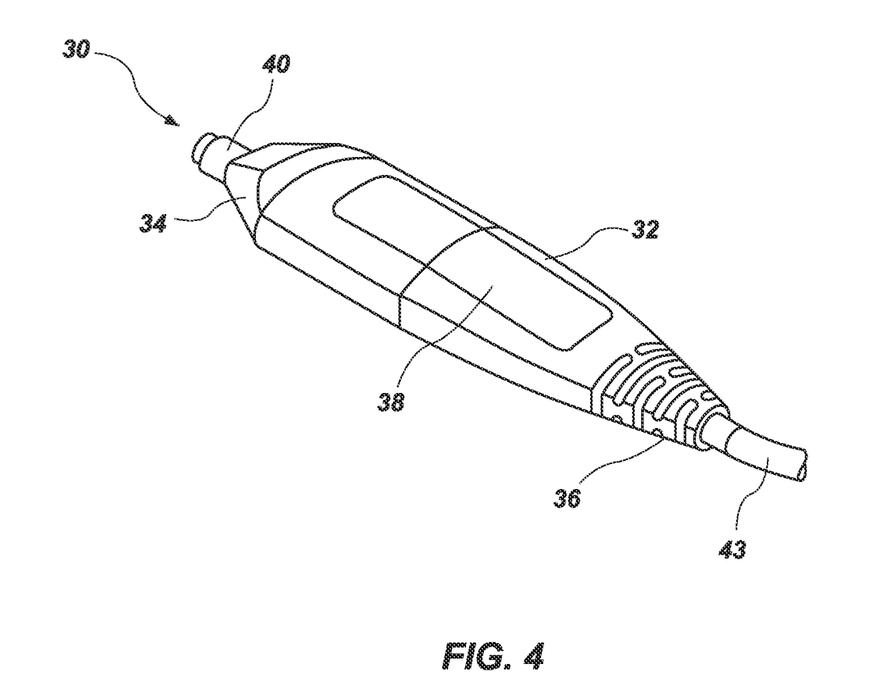
FIG. 4 illustrates an example of a radio frequency (RF) test probe, the RF test probe being shown without test leads.

FIG. 4 illustrates an example of a radio frequency (RF) test probe 30 with existing tips 14 and grounds 16 removed. The RF test probe 30 has a handle 32 that can be shaped to be gripped by a hand of a technician. The handle 32 can have physical features such as a tapered front end 34, a tapered rear end 36, planar side surfaces 38, and a front protrusion 40. The front protrusion 40 can comprise a first lead (e.g., similar to the first lead 13a of the test probe 10 of FIG. 1) for receiving a tip 14 (see FIG. 1) and the tapered front end 34 can comprise a second lead (e.g., similar to the second lead 13b of the RF test probe 10 of FIG. 1) socket for receiving a ground 16 (see FIG. 1). A cable 43 can extend from the tapered rear end 36 for connection to test equipment, such as an oscilloscope. Other RF test probes can comprise handles having different physical features and configurations. As will be described with reference to FIGS. 5 and 6, a housing of a RF test probe adapter as described herein can be sized and shaped to complement the physical features of any configuration of any handle of any radio frequency test probe. Thus, features of a different RF test probe handle type may require a different RF test probe adapter housing having complementary features specific to that handle. Or, in some examples, a housing may have features that are complementary to more than one handle type.

Figure 5:
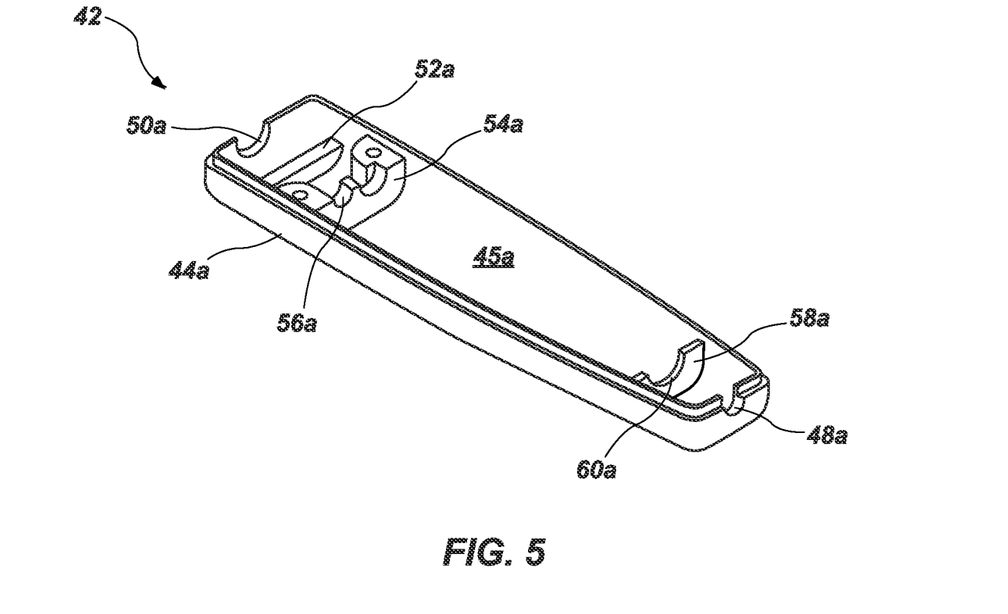
FIG. 5 illustrates a first portion of a housing of a RF test probe adapter in accordance with an example of the present disclosure, the housing being operable with a RF test probe, such as the RF test probe of FIG. 4, the housing being operable to secure the RF test probe and the cable adapter of FIG. 2 to form a RF test probe assembly.
Figure 6:
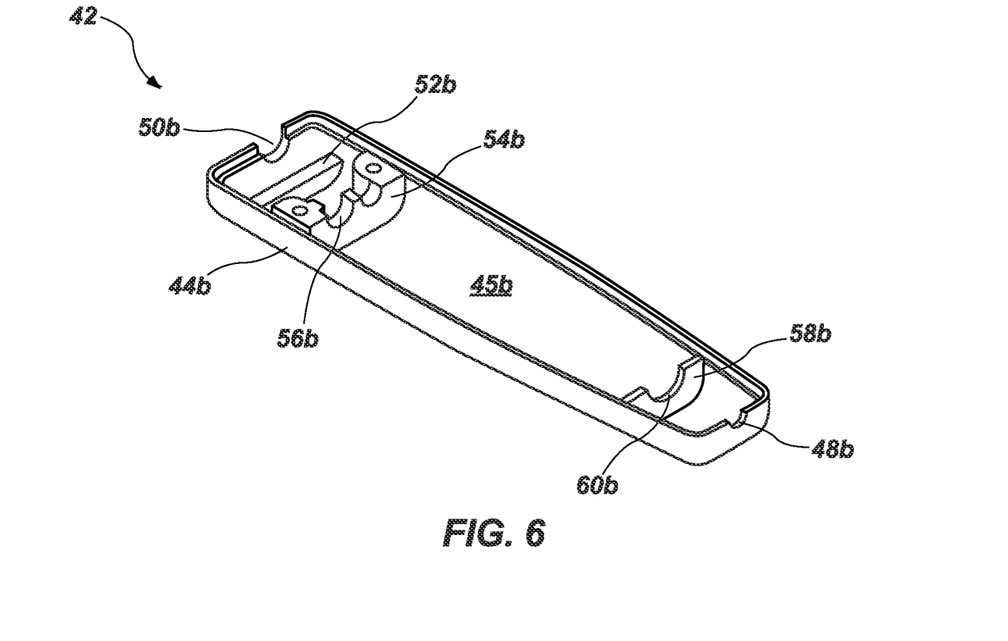
FIG. 6 illustrates an example of a second portion of the housing of the RF test probe adapter, the second portion of the housing being operable with the first portion of the housing of FIG. 5 to secure and retain the RF test probe of FIG. 4 and the cable adapter of FIG. 2 to form the RF test probe assembly.

FIG. 5 illustrates a first portion 44a of a radio frequency (RF) test probe adapter housing 42 sized and shaped to secure a RF test probe, such as the RF test probe 30 of FIG. 4, and a cable adapter, such as the cable adapter 18 of FIGS. 2 and 3. The RF test probe adapter housing 42 can have a complementary second portion, such as second portion 44b of the RF test probe adapter housing 42 shown in FIG. 6. The first and second portions 44a, 44b of the RF test probe adapter housing 42 can each have internal surfaces 45a, 45b that, when the first and second portions 44a, 44b are joined together, define an internal cavity sized and shaped to house the RF test probe and the cable adapter, thus forming a RF test probe assembly. In some examples, the internal surfaces of the first and second portions 44a, 44b can be mirror images of one another.

Each portion 44a, 44b of the RF test probe adapter housing 42 can have features sized and shaped to retain the RF test probe and the cable adapter. For example, first portion 44a can include a cable recess 48a formed in a rear wall, a cable connector recess 50a formed in a front wall, a cable adapter support ledge 52a, a RF test probe support ledge 54a having a protrusion receiving recess 56a, and a handle ledge 58a having a handle receiving recess 60a. Second portion 44b can have complementary features including a complementary cable recess 48b formed in a rear wall, a complementary cable connector recess 50b formed in a front wall, a complementary cable adapter support ledge 52b, a complementary RF test probe support ledge 54b having a complementary protrusion receiving recess 56b, and a complementary handle ledge 58b having a complementary handle receiving recess 60b. The features of the first and second portions 44a, 44b can be complementary to features of the RF test probe and the cable adapter. For example, with continued reference to FIGS. 5 and 5, and with reference also to the RF test probe of FIG. 4 and the cable adapter of FIGS. 2 and 3, cable recesses 48a, 48b are complementary to cable 42, cable connector recesses 50a, 50b are complementary to cable connector 20, cable adapter support ledges 52a, 52b are complementary to first planar surface 27 and second planar surface 29, protrusion receiving recesses 56a, 56b are complementary to protrusion 40, and handle receiving recesses 60a, 60b are complementary to tapered rear end 36. As used herein, the term "complementary" can mean that two or more components, or parts thereof, are operable with one another. For example, this can mean that one component can interface with one or more other components (e.g., one component can be received within another component, or a part thereof, or one component can be seated on or juxtaposed another component, or a part thereof).

The housing can be made of any suitable material. In one example, which is not intended to be limiting in any way, the housing 42 can be made of a polymer capable of managing (e.g., reducing) static electricity, such as electrostatic discharge (ESD) materials. Non-ESD materials could also be used, but these may not be preferred depending upon the particular use or application.

Figure 7:
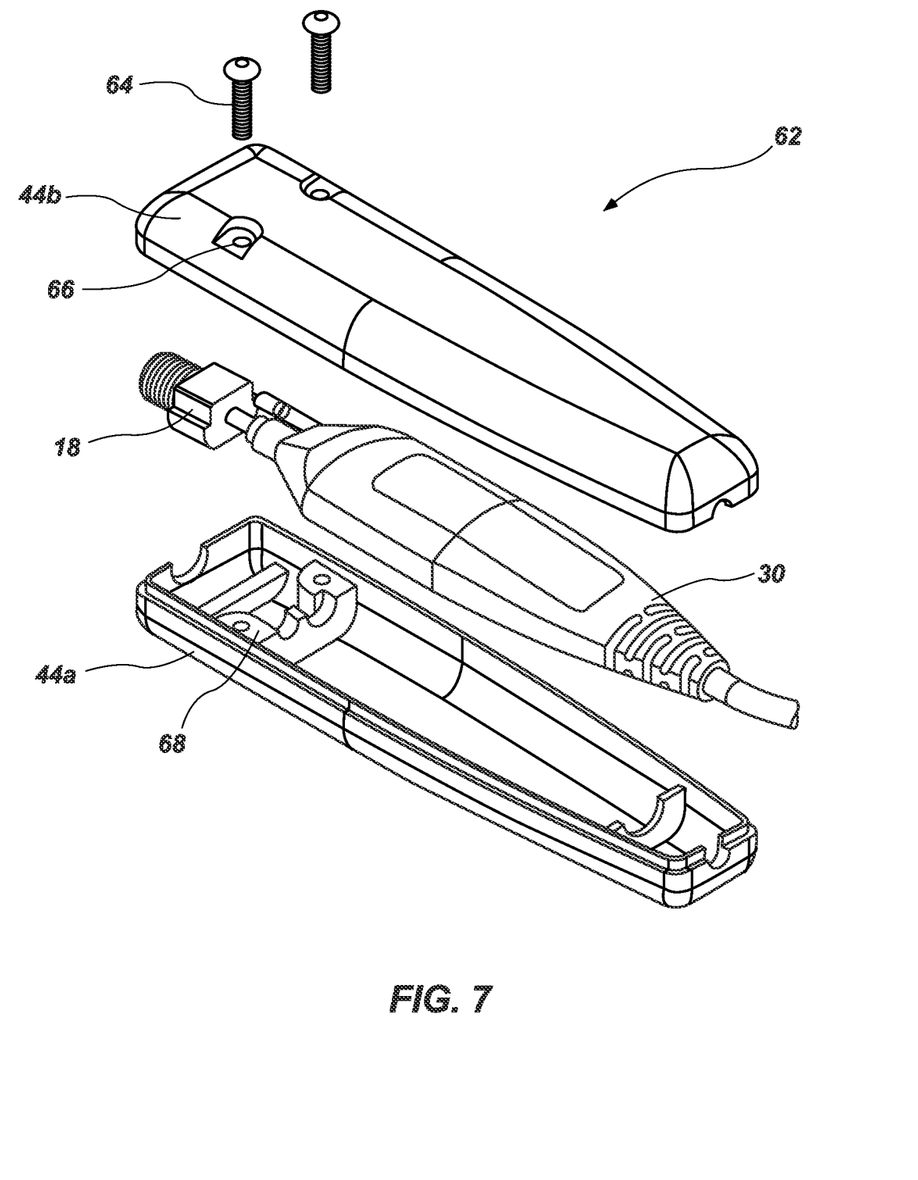
FIG. 7 illustrates an exploded view of the RF test probe of FIG. 4, and the RF test probe adapter, comprising the cable adapter of FIG. 2, and the housing being formed from the first and second portions of FIGS. 5 and 6, respectively, the assembly forming a RF test probe assembly in accordance with an example of the present disclosure.

FIG. 7 illustrates an example of a radio frequency (RF) test probe assembly 62 shown in an exploded view. The RF test probe assembly 62 comprises the RF test probe 30, and the RF test probe adapter operable to receive and support and connect with the RF test probe, wherein the RF test probe adapter comprises a cable adapter (e.g., the cable adapter 18 of FIG. 2) operable to electrically connect with the RF test probe 30 as discussed herein, and a housing (e.g., the housing 42 of FIGS. 5 and 6 being formed of the first portion 44a and the second portion 44b) operable to receive and house and support the RF test probe 30. The first portion 44a and the second portion 44b are arranged, such that the internal surfaces 45a, 45b of the first portion 44a and the second portion 44b face one another with the RF test probe 30 and the cable adapter 18 positioned between the first portion 44a and the second portion 44b of the housing 42. Second portion 44b can have holes 66 for receiving fasteners, such as screws, and allowing access to threaded holes 68 in the first portion 44a. Thus, a screw 64 can be passed through holes 66 and threaded into threaded holes 68 to clamp first portion 44a and second portion 44b together with the RF test probe 30 and the cable adapter 18 secured between the two portions 44a, 44b.

The complementary features of the first and second portions 44a, 44b of the housing 42 of the RF test probe adapter can secure the RF test probe 30 and the cable adapter 18 between the two portions 44a, 44b, thus forming the RF test probe assembly or system. For example, referring to FIGS. 2-6, and with continued reference to FIG. 7, cable recesses 48a, 48b can be configured to allow cable 42 to pass through the housing 42 from an internal cavity of the housing 42 while providing a compressive force to the cable 42 to hold it in place. The cable connector recesses 50a, 50b can be configured to allow the cable connector 20 of the cable adapter 18 to pass through the housing 42 from the internal cavity of the housing 42 and to provide a compressive force holding the cable connector 20 in place. Additionally, the cable connector recesses 50a, 50b restrain the cable adapter 20 from passing out of the internal cavity of the housing 42, since the base 26 has a larger cross section than the cable connector recesses 50a, 50b. at the same time, the cable adapter support ledges 52a, 52b provide a compressive force to the first and second planar surfaces 27, 29 of the base 26 of the cable adapter 18 to inhibit movement of the cable adapter 18 within the cavity. Those skilled in the art will recognize that different cable adapters having a base having the same physical shape as one another can be used interchangeably with a particular RF test probe where each of the features of the housing 42 physically complement the bases of each of the different cable adapters. The RF test probe 30 can be positioned and supported by the RF test probe adapter with the first and second pins 22, 24 of the cable adapter 18 electrically coupled to the leads of the RF test probe 30. The protrusion receiving recesses 56a, 56b can be configured to provide a compressive force to the protrusion 40 of the RF test probe 30 and hold the RF test probe 30 in position with the first and second pins 22, 24 electrically coupled to the leads of the electrical circuit test probe 30. The handle receiving recesses 60a, 60b can be configured to provide a compressive force to the handle of the RF test probe 30 (e.g., to the tapered portion 36 of the RF test probe 30) to inhibit the RF test probe 30 from translational (e.g., longitudinal, lateral, or a combination of these) and rotational movement with the housing 42, such that the first and second pins 22, 24 maintain proper contact with the leads of the RF test probe 30. Thus, by clamping the first and second portions 44a, 44b together using screws 64, the housing 42 of the RF test probe adapter secures the RF test probe 30 and the cable adapter 18 in a physically coupled configuration.

Once the RF test probe 30 and the cable adapter 18 are physically coupled together and supported within the housing 42 of the RF test probe adapter, a technician may test circuits having a standard coaxial cable connection by physically coupling a coaxial cable to the cable connector 20 extending from the housing 42. The pins 22, 24 of the cable adapter 18 electrically couple the conductors of the coaxial cable to leads of the of the RF test probe 30. Thus, the standard coaxial cable is operably coupled to the RF test probe 30 and the operator may test the RF circuit hands free. If a particular test no longer requires the use of the cable adapter 18, a technician can unscrew screws 64 to separate the first and second portions 44a, 44b and remove the RF test probe 30 to use in a conventional manner.

Figure 8:
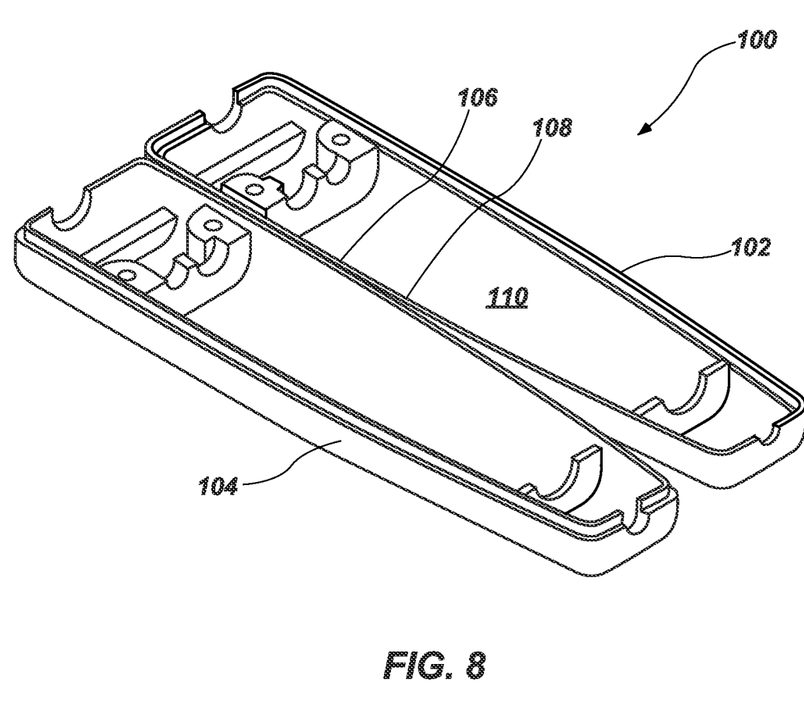
FIG. 8 illustrates a housing having first and second portions pivotally coupled together, the housing further comprising a hinge mechanism in the form of a compliant hinge mechanism, in accordance with an example of the present disclosure.
Figure 9:
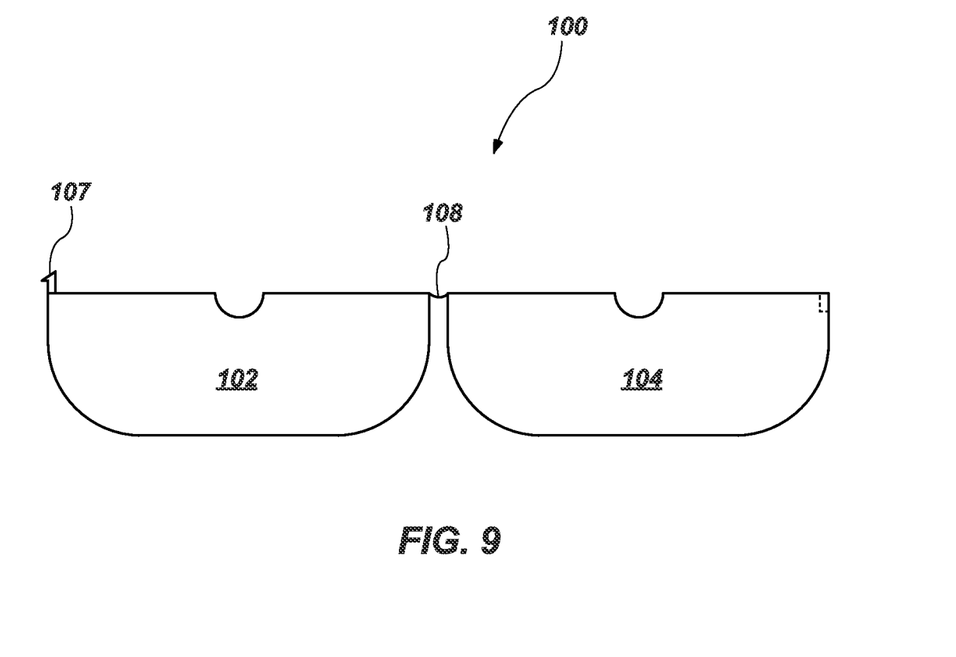
FIG. 9 illustrates an end view of the housing of FIG. 8, illustrating the hinge mechanism.

FIGS. 8 and 9 illustrate an example RF test probe adapter housing 100 of a RF test probe adapter in accordance with an example of the present disclosure, where the housing 100 is suitable for use with a cable adapter (e.g., the cable adapter 18 of FIGS. 2 and 3) and a RF test probe (e.g., the RF test probe 30 of FIG. 4). The RF test probe adapter housing 100 is similar to the RF test probe adapter housing 42 of the RF test probe adapter discussed above, and has similar features for securing the cable adapter 18 and the RF test probe 30 within an inner cavity 110 of the RF test probe adapter housing 100. However, in this example, the RF test probe adapter housing 100 can further comprise a hinge mechanism or hinged connection 106 that facilitates the pivotal coupling of a first portion 102 and a second portion 104 of the RF test probe adapter housing 100. The housing can further comprise a securing member 107 in the form of a latch of some type, or another object or mechanism (e.g., the first and second portions 102, 104 can comprise snap together interfaces) for securing the first and second portions 102, 104 together upon being pivoted or rotated about the hinge mechanism 106. The hinge mechanism can be supported along a lateral side of the RF test probe adapter housing 100 by way of a hinge mechanism or hinged connection 106. In one aspect, the hinged connection 106 can comprise a traditional hinge having knuckles and a pin. In another aspect, such as in the example of FIG. 8, and as shown in more detail in FIG. 9, the hinge mechanism or the hinged connection 106 can comprise a compliant type of hinge, wherein a thinned portion 108 of bendable material extends from or otherwise secures the first portion 102 and the second portion 104 together, and facilitates rotation of the first and second portions 102, 104 about the rotational axis of the hinged mechanism 106, in this case, defined by the thinned portion 108. Thus, the RF test probe 30 and the cable adapter 18 can be positioned between the first portion 102 and the second portion 104, and the two portions 102, 104 can be rotated relative to one another about the compliant hinged connection 106 and secured together via the securing member 107 to enclose and support the RF test probe 30 and the cable adapter 18 in a secured manner. It is contemplated that the first portion 102 and the second portion 104 of the RF test probe adapter housing 100 can be pivotally coupled together or hinged in many different ways, and using many different types of hinge mechanisms. As such, those specifically described herein and shown in the drawings are not intended to be limiting in any way. In some examples, the housing 100 can further comprise a clamp, which can be present and supported on a lateral side of the RF test probe adapter housing 100 opposite the hinged connection 106. Thus, the RF test probe 30 and the cable adapter 18 can be secured within the RF test probe adapter housing 100 by clamping the two portions 102, 104 together once they enclose the radio circuit test probe 30 and the cable adapter 18. The clamp can be released by a technician to remove the RF test probe 30 if a different test attachment having a different tip and ground configuration is required.

It is to be understood that the examples set forth herein are not limited to the particular structures, process steps, or materials disclosed, but are extended to equivalents thereof as would be recognized by those ordinarily skilled in the relevant arts. It should also be understood that terminology employed herein is used for the purpose of describing particular examples only and is not intended to be limiting.

Furthermore, the described features, structures, or characteristics may be combined in any suitable manner in one or more examples. In the description, numerous specific details are provided, such as examples of lengths, widths, shapes, etc., to provide a thorough understanding of the technology being described. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Although the disclosure may not expressly disclose that some embodiments or features described herein may be combined with other embodiments or features described herein, this disclosure should be read to describe any such combinations that would be practicable by one of ordinary skill in the art. The use of "or" in this disclosure should be understood to mean non-exclusive or, i.e., "and/or," unless otherwise indicated herein.

While the foregoing examples are illustrative of the principles of the invention in one or more particular applications, it will be apparent to those of ordinary skill in the art that numerous modifications in form, usage and details of implementation can be made without the exercise of inventive faculty, and without departing from the principles and concepts described herein. Accordingly, it is not intended that the invention be limited, except as by the claims set forth below.

What is claimed is:

1. A radio frequency (RF) test probe adapter operable for use as a test attachment with a separate RF test probe comprising:
    a cable adapter comprising:
        a cable connector configured to physically couple to a connector of a coaxial cable to facilitate testing of electrical circuits having a coaxial cable connection,
        a base, the base supporting the cable connector;
        a first pin supported by and extending from the base, the first pin being operable to be inserted into a first lead of the RF test probe to electrically couple a center conductor of the coaxial cable to the first lead of the RF test probe, and
        a second pin supported by and extending from the base, the second pin being operable to be inserted into a second lead of the RF test probe to electrically couple an outer conductor of the coaxial cable to the second lead of the test probe, wherein the second pin is offset longitudinally from the first pin; and
    a housing sized and shaped to secure the RF test probe and the cable adapter in a physically coupled configuration.

2. The RF test probe adapter of claim 1, wherein the housing further comprises a ledge operable to interface with and secure the base of the cable adapter within the housing.

3. The RF test probe adapter of claim 2, wherein the base is configured to be received within the housing, and to be removably supported by the housing, such that the cable adapter is interchangeable with a second cable adapter.

4. The RF test probe adapter of claim 2, wherein the housing comprises a first portion configured to support a first side of the RF test probe and a first side of the base of the cable adapter and a second portion configured to support a second side of the RF test probe and a second side of the base of the cable adapter.

5. The RF test probe adapter of claim 4, wherein the housing further comprises a hinge mechanism, and the first portion and the second portion are pivotally coupled together via the hinge mechanism.

6. The RF test probe adapter of claim 1, wherein the housing is made, at least in part, of an electrostatic discharge material.

7. A radio frequency (RF) test probe assembly comprising:
    a radio frequency (RF) test probe having a first lead and a second lead;
    a radio frequency (RF) test probe adapter operable to be electrically coupled to the RF test probe as a test attachment, the radio frequency (RF) test probe adapter comprising:
    a cable adapter comprising:
    a cable connector configured to physically couple to a connector of a coaxial cable to facilitate testing of electrical circuits having a coaxial cable connection,
    a base, the base supporting the cable connector;
    a first pin supported by and extending from the base, the first pin being inserted into a first lead of the RF test probe to electrically couple a center lead of the coaxial cable to the first lead of the RF test probe, and
    a second pin supported by and extending from the base, the second pin being inserted into a second lead of the RF test probe to electrically couple an outer conductor of the cable adapter to the second lead of the test probe, wherein the second pin is offset longitudinally from the first pin; and
    a housing removably securing the RF test probe and the cable adapter in a physically coupled configuration.

8. The RF test probe assembly of claim 7, wherein the housing further comprises a ledge removably securing the base of the cable adapter within the housing.

9. The RF test probe assembly of claim 7, further comprising a second cable adapter operable for use with the RF test probe, wherein a base of the second cable adapter is configured to be received within the housing, and to be removably supported by the housing, such that the second cable adapter is interchangeable with the cable adapter.

10. The RF test probe assembly of claim 7, wherein the housing comprises a first portion configured to support a first side of the RF test probe and a first side of the base of the cable adapter and a second portion configured to support a second side of the RF test probe and a second side of the base of the cable adapter.

11. The RF test probe assembly of claim 10, wherein the housing further comprises a hinge mechanism, and the first portion and the second portion are pivotally coupled together via the hinge mechanism.

12. A method for facilitating adaption of leads of a radio frequency (RF) test probe to a coaxial cable via a radio frequency (RF) test probe adapter operable to be electrically coupled to the RF test probe as a test attachment, the method comprising:

configuring a cable adapter to have a cable connector operable to physically couple to a coaxial cable to facilitate testing of electrical circuits having a coaxial cable connection;

configuring the cable adapter to comprise a base, the base supporting the cable connector;

supporting a first pin from the base;

supporting a second pin from the base, wherein the second pin is offset longitudinally from the first pin;

inserting the first pin of the cable adapter into a first lead of the RF test probe operable to electrically couple a center lead of the coaxial cable to the first lead of the RF test probe;

inserting the second pin of the cable adapter into a second lead of the RF test probe to electrically couple an outer conductor of the coaxial cable to the second lead of the RF test probe; and configuring a housing to have an internal cavity sized and shaped to secure the RF test probe and the cable adapter in a physically coupled configuration.

13. The method of claim 12, further comprising configuring the internal cavity to be operable to secure a second cable adapter in a physically coupled configuration with the RF test probe, the second cable adapter being interchangeable with the cable adapter.

14. The method of claim 12, further comprising configuring a second cable adapter to be interchanged with the cable adapter in the housing and to have a second cable connector, a first pin operable with the first lead of the RF test probe, and a second pin operable with the second lead of the RF test probe.

15. The method of claim 14, wherein the base comprises a first base and the second cable adapter has a second base supporting the cable connector and each of the first and second pins of the second cable connector, and wherein the first base and the second base have substantially a same shape.

16. The method of claim 12, further comprising configuring the housing to have a first portion operable to support a first side of a RF test probe and a second portion, joinable to the first portion, and operable to support a second side of the RF test probe.

17. The method of claim 16, further comprising configuring the housing with a hinge mechanism to facilitate pivotal coupling of the first portion and the second portion.

* * * * *

UNITED STATES PATENT AND TRADEMARK OFFICE
CERTIFICATE OF CORRECTION

| | | |
|---|---|---|
| PATENT NO. | : 12,092,657 B2 | Page 1 of 1 |
| APPLICATION NO. | : 16/802405 | |
| DATED | : September 17, 2024 | |
| INVENTOR(S) | : Stuart et al. | |

It is certified that error appears in the above-identified patent and that said Letters Patent is hereby corrected as shown below:

In the Specification

In Column 4, Line 54, delete "Subminature" and insert --SubMiniature-- therefor

In Column 6, Line 65, delete "42," and insert --43,-- therefor

In Column 7, Line 48, delete "42" and insert --43-- therefor

In Column 7, Line 50, delete "42" and insert --43-- therefor

Signed and Sealed this
Twenty-fifth Day of November, 2025

John A. Squires
*Director of the United States Patent and Trademark Office*